(12) United States Patent
Chang et al.

(10) Patent No.: US 8,568,904 B2
(45) Date of Patent: Oct. 29, 2013

(54) HOUSING AND METHOD FOR MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Yi-Chi Chan, New Taipei (TW); Xiao-Qiang Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 191 days.

(21) Appl. No.: 13/207,110

(22) Filed: Aug. 10, 2011

(65) Prior Publication Data

US 2012/0219822 A1 Aug. 30, 2012

(30) Foreign Application Priority Data

Feb. 28, 2011 (CN) .......................... 2011 1 0047553

(51) Int. Cl.
*B32B 9/00* (2006.01)

(52) U.S. Cl.
USPC .................... 428/697; 204/192.1; 204/192.15; 427/327; 428/336; 428/469; 428/472; 428/701; 428/702

(58) Field of Classification Search
USPC ........... 204/192.1, 192.15; 427/327; 428/336, 428/469, 472, 698, 701, 702
See application file for complete search history.

(56) References Cited

U.S. PATENT DOCUMENTS 6,770,923 B2 * 8/2004 Nguyen et al. ................ 257/295
7,808,168 B2 * 10/2010 Kuroda et al. ................ 428/323

FOREIGN PATENT DOCUMENTS

EP          0 784 101          * 7/1997

* cited by examiner

*Primary Examiner* — Archene Turner
(74) *Attorney, Agent, or Firm* — Altis & Wispro Law Group, Inc.

(57) ABSTRACT

A housing is provided which includes an aluminum or aluminum alloys substrate, an aluminum layer and a corrosion resistant layer formed on the aluminum or aluminum alloys substrate in that order. The corrosion resistant layer is an Al—O—N layer. Then, La ions is implanted in the Al—O—N layer by ion implantation process. The atomic percentages of N and O in the Al—O—N gradient layer gradually increase from the bottom of the layer near the aluminum or aluminum alloys substrate to the top of the layer away from aluminum or aluminum alloys substrate by physical vapor deposition. The housing has a higher corrosion resistance. A method for making the housing is also provided.

11 Claims, 4 Drawing Sheets

HOUSING AND METHOD FOR MAKING THE SAME

This application is related to co-pending U.S. patent application Ser. Nos. 13/191,609, 13/191,602, entitled "HOUSING AND METHOD FOR MAKING THE SAME". Such applications have the same assignee as the present application. The above-identified applications are incorporated herein by reference.

BACKGROUND

1. Technical Field

The present disclosure relates to a housing and a method for making the same.

2. Description of Related Art

Due to properties such as light weight and quick heat dissipation, aluminum and aluminum alloys are widely used in manufacturing components (such as housings) of electronic devices. Aluminum and aluminum alloys are usually anodized to form an oxide coating thereon to achieve a decorative and wear resistant surface. However, the anodizing process is complicated and not very effective.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary process for surface treating aluminum or aluminum alloys and housings made of aluminum or aluminum alloys treated by the surface treatment. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
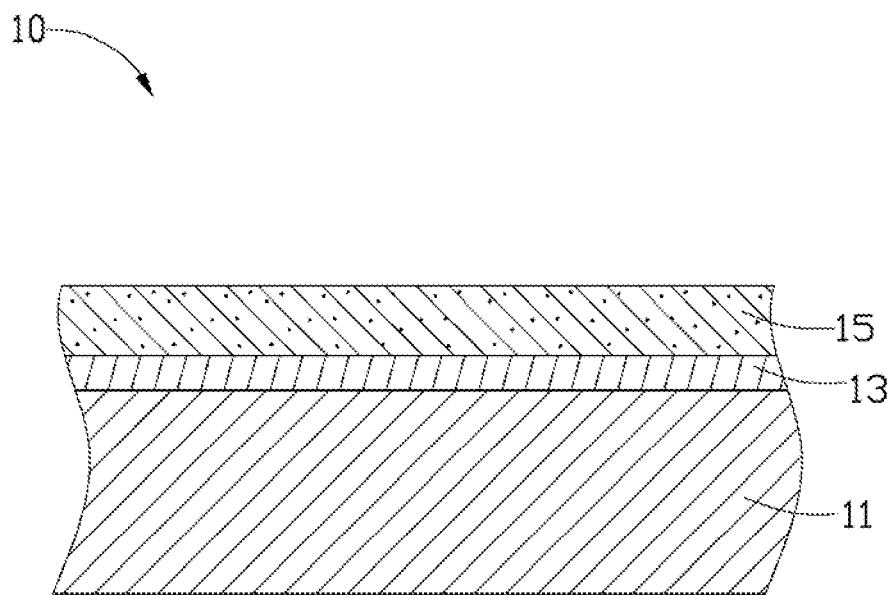
FIG. 1 illustrates a cross-sectional view of an exemplary embodiment of a housing made of aluminum or aluminum alloys treated by present process.

FIG. 1 shows a device housing 10 according to an exemplary embodiment. The device housing 10 includes an aluminum or aluminum alloys substrate 11 having an aluminum layer 13 and a corrosion resistant layer 15 formed thereon and in that order.

The aluminum or aluminum alloys substrate 11 may be produced by punching. The corrosion resistant layer 15 is an Al—O—N gradient layer doped with La ions implanted by the ion implantation process. The atomic percentages of N and O in the Al—O—N gradient Layer gradually increase from the bottom of the layer near the aluminum or aluminum alloys substrate to the top of the layer away from aluminum or aluminum alloys substrate.

Figure 3:
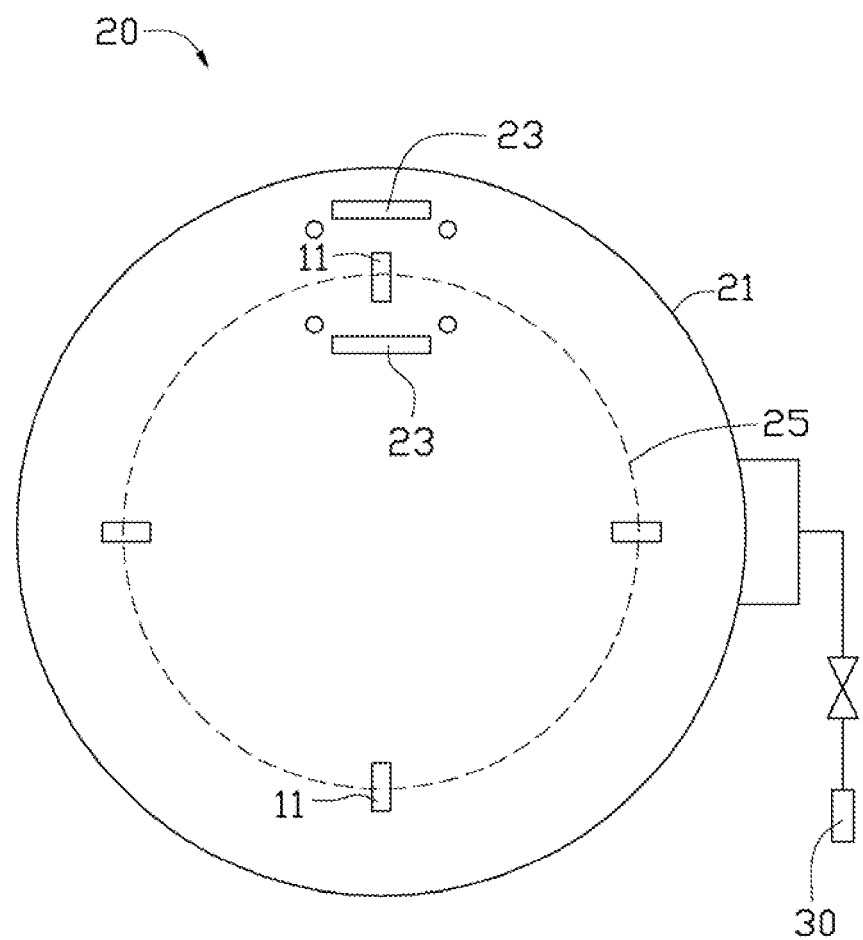
FIG. 3 is a schematic view of a PVD machine used in the present process.

FIG. 3 shows a vacuum sputtering equipment 20, which includes a vacuum chamber 21 and a vacuum pump 30 connected to the vacuum chamber 21. The vacuum pump 30 is used for evacuating the vacuum chamber 21. The vacuum chamber 21 has a number of aluminum targets 23 and a rotary rack (not shown) positioned therein. The rotary rack drives the aluminum or aluminum alloy substrate 11 to rotate along a circular path 25, and the substrate 11 also rotates on its own axis while rotating along the circular path 25.

Figure 2:
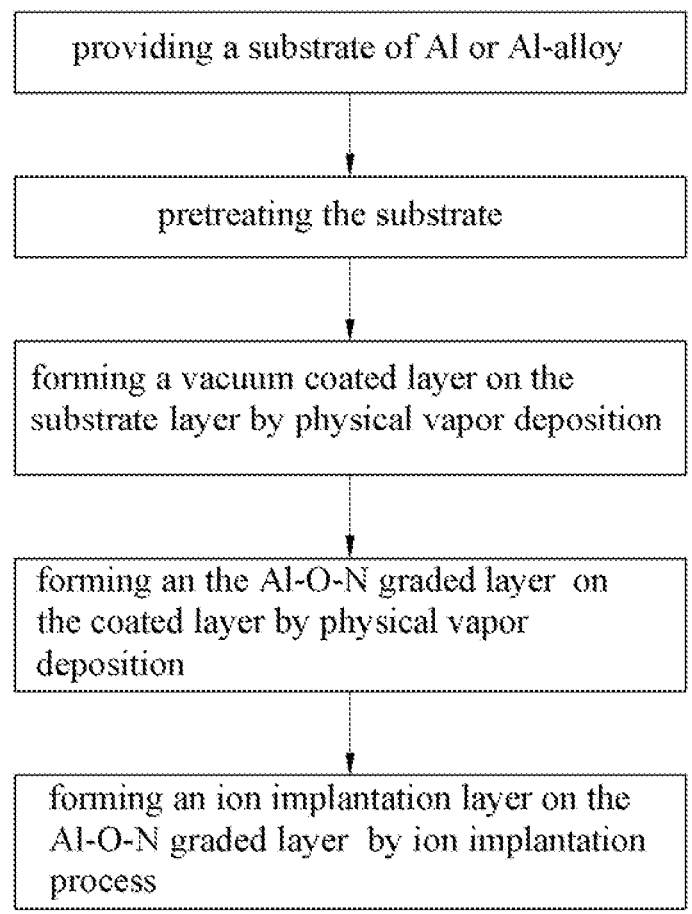
FIG. 2 is a block diagram of an exemplary process for surface treating aluminum or aluminum alloys

FIG. 2 shows an exemplary method for making the device housing 10, which may include the following steps:

The aluminum or aluminum alloys substrate 11 is pre-treated. The pre-treating process may include the following steps:

The aluminum or aluminum alloys substrate 11 is cleaned with alcohol solution in an ultrasonic cleaner (not shown), to remove impurities such as grease or dirt from the aluminum or aluminum alloys substrate 11. Then, the substrate 11 is dried.

The aluminum or aluminum alloys substrate 11 is plasma cleaned. The aluminum or aluminum alloys substrate 11 is positioned in the rotary rack of the vacuum chamber 21. The vacuum chamber 21 is then evacuated to about $3.0 \times 10^{-8}$ Pa. Argon gas (abbreviated as Ar gas having a purity of about 99.999%) is used as sputtering gas and fed into the vacuum chamber 21 at a flow rate of about 500 standard-state cubic centimeters per minute (sccm). The aluminum or aluminum alloys substrate 11 is applied with a negative bias voltage in a range of about −100 volts (V) to about −180 V, then high-frequency voltage is produced in the vacuum chamber 21 and the Ar gas is ionized into plasma. The plasma strikes the surface of the aluminum or aluminum alloys substrate 11 to clean the surface of the aluminum or aluminum alloys substrate 11. The plasma cleaning of the aluminum or aluminum alloys substrate 11 lasts about 3 minutes (min) to about 10 min.

The aluminum layer 13 is vacuum sputtered on the pre-treated an aluminum or aluminum substrate 11. In one exemplary embodiment, an aluminum layer 13 is then formed on the aluminum or aluminum alloys substrate 11 by physical vapor deposition (PVD). The formation of the aluminum layer 13 uses argon gas as the sputtering gas. The flux of the argon is from about 100 sccm to about 300 sccm. During sputtering, the power of the aluminum targets is in a range of about 2 kw to about 8 kw, and the aluminum or aluminum substrate 11 is applied with a negative bias voltage in a range of about −300 V to about −500 V. The vacuum sputtering to the aluminum layer takes about 5 min to about 10 min. The aluminum layer 13 has a thickness in a range of about 100 nm to about 300 nm.

The corrosion resistant layer 15 is formed on the aluminum layer 13. The corrosion resistant layer 15 is an Al—O—N gradient layer formed by magnetron sputtering, and then the Al—O—N gradient layer is doped with La ions by the ion implantation process. An exemplary magnetron sputtering process for forming the corrosion resistant layer 15 includes the following steps: at first simultaneously applying argon, oxygen, and nitrogen, the flux of the argon being from about 100 sccm to about 300 sccm, the flux of the oxygen is from about 10 sccm to about 20 sccm and the flux of the nitrogen is from about 10 sccm to about 20 sccm; applying a bias voltage to the substrate in a range of about −150 V to about −500 V. During this process, the flux of the nitrogen and oxygen flow rates are both increased approximately about 10 sccm to about 20 sccm at depositing interval of about every 10 minutes to about 15 minutes. The evaporation of the corrosion resistant layer 15 takes a total time of about 30 min to about 90 min. The corrosion resistant layer 15 has a thickness in a range of about 0.5 μm-about 2.0 μm.

The formation process of the corrosion resistant layer 15 may form a dense Al—O—N solid phase, thus improving the density of the corrosion resistant layer 15. Therefore, corrosion resistance of the device housing 10 can be improved.

The atomic percentages of N and O in the corrosion resistant layer 15 gradually increase from the bottom of the layer near the aluminum or aluminum alloys substrate 11 to the top of the layer away from the aluminum or aluminum alloys substrate, which can decrease the mismatching of crystal lattices between the corrosion resistant layer 15 and aluminum layer 13. The formation of the aluminum layer 13 between the aluminum or aluminum alloy substrate 11 and the corrosion resistant layer 15 may improve the interface mismatch between the aluminum or aluminum alloys substrate 11 and the corrosion resistant layer 15, and can decrease the residual stress of the corrosion resistant layer 15. Thus the device housing 10 becomes less prone to stress corrosion. The stress corrosion refers to the metal invalidity phenomenon under action of residual or applied stress and corrosive medium. The device housing 10 has a high corrosion resistance.

Lastly, the corrosion resistant layer 15 is implanted with La ion. The implanted ions can fill pores of the corrosion resistant layer 15 to improve the density of the corrosion resistant layer 15. Furthermore, the corrosion resistant layer 15 is a homogeneous amorphous film. Thus, the corrosion resistance of the aluminum or aluminum alloys substrate 11 can be improved.

Figure 4:
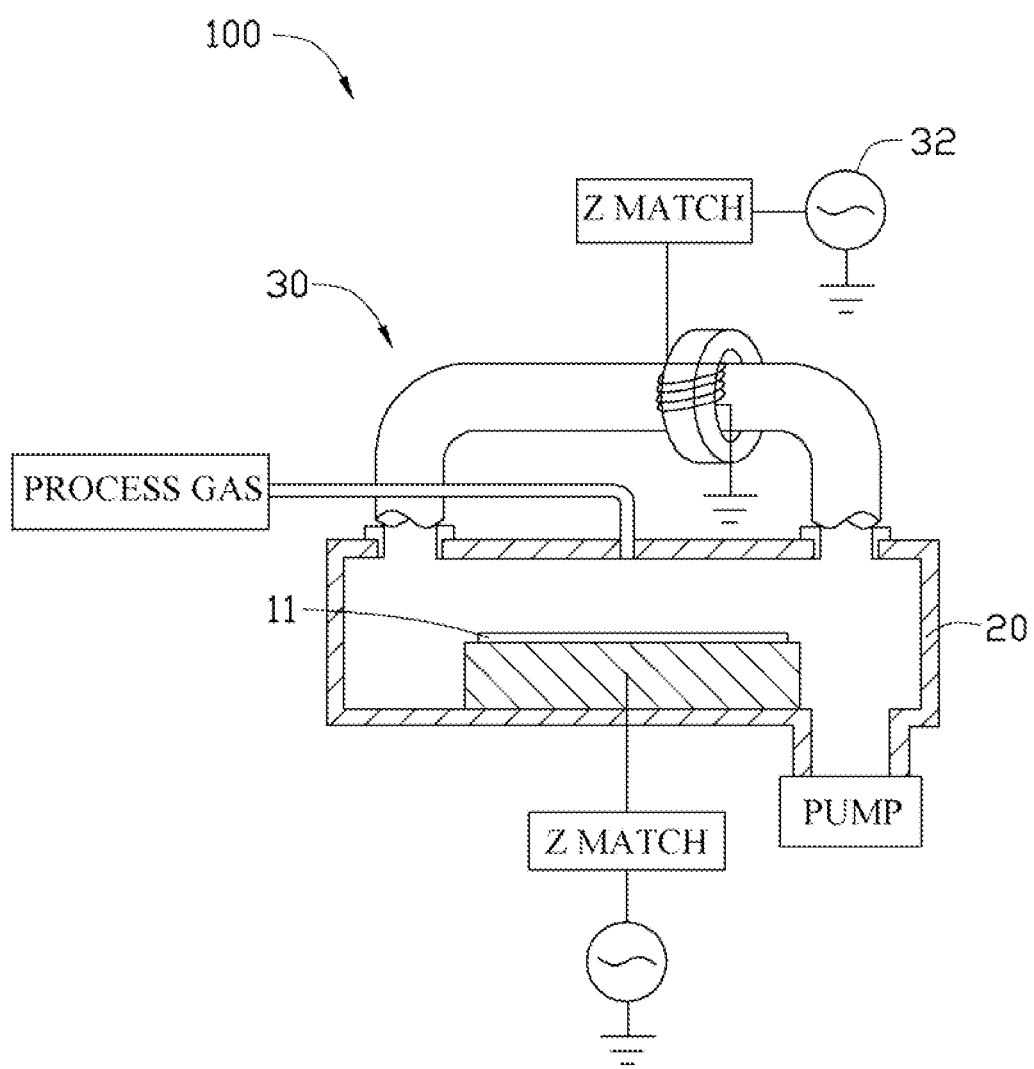
FIG. 4 is a schematic view of an ion implantation machine used in the present process.

La is implanted in the corrosion resistant layer 15 by ion implantation process. In an exemplary embodiment, the ion implantation process is performed by supplying a process gas into a processing chamber 20 of an ion implantation machine 100 as shown in FIG. 4. The machine 100 includes a plasma source 30 coupled to a RF source power 32. Plasma is generated by applying the RF source power 32 to dissociate ions from the process gas, thereby forming a source of ions that are accelerated toward and implanted into the substrate 11. The implanted ions react with the atoms and molecules of the surface layer of the substrate 11. Thus, the ion implantation on corrosion resistant layer 15 is formed and is tightly bonded the substrate 11.

The ion implantation process may be performed under the following conditions: The processing chamber 20 is evacuated to maintain a pressure of about $1\times10^{-4}$ Pa. The process gas supplied into the processing chamber 20 maintains a working atmosphere from about 0.1 Pa to about 0.5 Pa. The RF source power 32 may be controlled from about 30 kV to about 100 kV to form a beam of ions having an intensity of about 1 milliampere (mA) to about 5 mA. The density of the ions implanted in the ion implantation layer 13 may be from about $1\times10^{16}$ ions per square centimeter (ions/cm$^2$) to about $1\times10^{18}$ ions/cm$^2$. The processing chamber 20 may be maintained at a normal room temperature. The La metallurgical bonds with the Al—O—N gradient layer by implantation, and forms the amorphous property. The structural characteristics of amorphous includes isotropic, no dislocation, and so on. Furthermore, the Al—O—N gradient layer is a homogeneous amorphous film. And thus, the corrosion resistance of the substrate 11 can be improved.

EXAMPLES

Experimental examples of the present disclosure are described as following.

Example 1

The vacuum sputtering equipment 20 used in example 1 is a medium frequency magnetron sputtering equipment (model No. SM-1100H) manufactured by South Innovative Vacuum Technology Co., Ltd.

The substrate is made of aluminum and aluminum alloys.

Plasma cleaning: Ar gas is fed into the vacuum chamber 21 at a flow rate of about 280 sccm. The aluminum or aluminum alloys substrate 11 is applied with a negative bias voltage at −300 V. The plasma cleaning the aluminum or aluminum alloys substrate 11 takes about 9 min.

Sputtering of the aluminum layer 13: Ar gas is fed into the vacuum chamber 21 at a flow rate of about 100 sccm. The power of the aluminum targets 23 is 2 kw and the aluminum and aluminum alloys substrate 11 is applied with a negative bias voltage of −500 V. The depositing of the aluminum layer 13 takes 5 min.

Sputtering of the Al—O—N gradient layer: Argon, oxygen, and nitrogen are simultaneously applied. The flux of the argon is about 100 sccm, the flux of the oxygen is about 10 sccm, and the flux of the nitrogen is about 10 sccm. A bias voltage about −500 V is then applied to the substrate. Both the nitrogen and oxygen flow rates are each increased about 10 sccm about every 10 minutes and evaporate the aluminum target at a power of about 5 kw. The depositing of the Al—O—N gradient layer takes a total of 30 min.

Ion implanting La ions comprises the following steps: the processing chamber is evacuated to maintain a pressure of about $1\times10^{-4}$ Pa, the process gas maintains a working atmosphere of about 0.1 Pa in the processing chamber. The RF source power is at about 30 kV to form an ion beam with an intensity of about 1 mA. The density of the ions implanted in the ion implantation layer is about $1\times10^{16}$ ions/cm$^2$.

Example 2

The vacuum sputtering equipment 20 used in example 1 is a medium frequency magnetron sputtering equipment (model No. SM-1100H) manufactured by South Innovative Vacuum Technology Co., Ltd.

The substrate is made of aluminum and aluminum alloys.

Plasma cleaning: Ar gas is fed into the vacuum chamber 21 at a flow rate of about 480 sccm. The aluminum or aluminum alloy substrate 11 is applied with a negative bias voltage at −300 V. The plasma cleaning the aluminum or aluminum alloy substrate 11 takes about 7 min.

Sputtering of the aluminum layer 13: Ar gas is fed into the vacuum chamber 21 at a flow rate of about 200 sccm. The power of the aluminum targets 23 is 2 kw and the aluminum and aluminum alloys substrate 11 is applied with a negative bias voltage of −400 V. The depositing of the aluminum layer 13 takes 7 min.

Sputtering of the Al—O—N gradient layer: Argon, oxygen, and nitrogen are simultaneously applied, the flux of the argon is about 200 sccm, the flux of the oxygen being about 15 sccm and the flux of the nitrogen is about 60 sccm; A bias voltage −300 V is then applied to the substrate. Both the nitrogen and oxygen flow rates are each increased 12 sccm about every 15 minutes and evaporate the aluminum target at a power about 5 kw. The depositing of the Al—O—N gradient layer takes a total of 60 min.

Ion implanting La ions comprises the following steps: The processing chamber is evacuated to maintain a pressure of about $1\times10^{-4}$ Pa, the process gas maintains a working atmosphere of about 0.1 Pa in the processing chamber. The RF source power is at about 60 kV to form an ion beam with an intensity of about 2 mA. The density of the ions implanted in the ion implantation layer is about $1\times10^{17}$ ions/cm$^2$.

Example 3

The vacuum sputtering equipment 20 used in example 3 is the same in example 1.

The substrate 11 is made of aluminum and aluminum alloys.

Plasma cleaning: Ar is fed into the vacuum chamber 21 at a flow rate of about 160 sccm. The aluminum or aluminum alloys substrate 11 is applied with a negative bias voltage at −400 V. The plasma cleaning the aluminum or aluminum alloy substrate 11 takes about 6 min.

Sputtering of the aluminum layer 13: Ar gas is fed into the vacuum chamber 21 at a flow rate of about 300 sccm. The power of the aluminum targets 23 is 8 kw and the aluminum and aluminum alloys substrate 11 is applied with a negative bias voltage of −300 V. The depositing of the aluminum layer 13 takes a total of about 10 min.

Sputtering of the Al—O—N gradient layer: simultaneously applying argon, oxygen, and nitrogen, the flux of the argon is about 300 sccm, the flux of the oxygen being is 100 sccm, and the flux of the nitrogen is about 20 sccm. A bias voltage about −150 V is then applied to the substrate; Both the nitrogen and oxygen flow rates are each increased about 20 sccm about every 15 minutes and evaporate the aluminum target at a power of about 5 kw. The depositing of the Al—O—N gradient layer takes a total of about 90 min.

Ion implanting La ions comprises the following steps: The processing chamber is evacuated to maintain a pressure of about $1 \times 10^{-4}$ Pa, and the process gas maintains a working atmosphere of about 0.1 Pa in the processing chamber. The RF source power is at about 100 kV to form an ion beam with an intensity of about 5 mA. The density of the ions implanted in the ion implantation layer is about $1 \times 10^{18}$ ions/cm$^2$.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A housing, comprising:
   a substrate made of aluminum or aluminum alloy;
   an aluminum layer formed on the aluminum or aluminum alloy;
   a corrosion resistant layer formed on the aluminum layer;
   wherein the corrosion resistant layer is an Al—O—N gradient layer doped with La ions, the atomic percentages of N and O in the Al—O—N gradient layer gradually increase from the bottom of the layer near the aluminum or aluminum alloys substrate to the top of the layer away from aluminum or aluminum alloys substrate.

2. The housing as claimed in claim 1, wherein the corrosion resistant layer has a thickness in a range of about 0.5 μm to about 2.0 μm.

3. The housing as claimed in claim 1, wherein the aluminum layer has a thickness in a range of about 100 nm-about 300 nm.

4. A method for surface treating aluminum or aluminum alloys, the method comprising the following steps of:
   providing a substrate made of aluminum or aluminum alloys;
   forming an aluminum layer on the substrate by physical vapor deposition;
   forming a corrosion resistant layer formed on the aluminum layer, the corrosion resistant layer is an Al—O—N gradient layer doped with La ions implanted by ion implantation process, the atomic percentages of N and O in the Al—O—N gradient layer gradually increase from the bottom of the layer near the aluminum or aluminum alloys substrate to the top of the layer away from aluminum or aluminum alloys substrate.

5. The method as claim in claim 4, wherein the step of forming Al—O—N gradient layer comprises the following steps: simultaneously applying argon, oxygen, and nitrogen, the flux of the argon being from about 100 sccm to about 300 sccm, the flux of the oxygen being from about 10 sccm to about 20 sccm and the flux of the nitrogen being from about 10 sccm to about 20 sccm; applying a bias voltage to the substrate in a range of about −150 volt to about −500 volt; the flux of the nitrogen and oxygen flow rates are both increased approximately 10 sccm to 20 sccm at depositing interval of about every 10 minutes to about 15 minutes and evaporating the Al—O—N gradient layer taking a total time of about 30 minutes to about 90 minutes.

6. The method as claim in claim 4, wherein, ion implanting La ions comprises the following steps: the processing chamber is evacuated to maintain a vacuum degree of about $1 \times 10^{-4}$ Pa, the process gas maintains a working atmosphere from about 0.1 Pa to about 0.5 Pa in the processing chamber.

7. The method as claim in claim 6, wherein the step of ion implanting La ions further comprises supplying a RF source power to dissociate the ions from the process gas.

8. The method as claim in claim 6, wherein the RF source power is controlled from about 30 to about 100 kV to form a beam of the ions with an intensity from about 1 to about 5 mA.

9. The method as claimed in claim 6, wherein the density of the ions implanted in the ion implantation layer is in a range of about $1 \times 10^{16}$ ions/cm$^2$ to about $1 \times 10^{18}$ ions/cm$^2$.

10. The method as claimed in claim 4, wherein the step of forming the aluminum layer is achieved in the following condition: using argon gas as sputtering gas, the flux of the argon being from about 100 sccm to about 300 sccm; magnetron sputtering the temperature of aluminum layer is in a range of about 180° C. to about 250° C., the power of the aluminum targets is in a range of about 2 kw to about 8 kw, the substrate is applied with a negative bias voltage is in a range of about −300 V to about −500 V, vacuum sputtering the aluminum layer takes about 5 min to about 10 min.

11. The method as claimed in claim 4, wherein the method further comprises polishing and ultrasonically cleaning the substrate before forming the aluminum layer.

* * * * *